United States Patent
Leblans et al.

(10) Patent No.: US 9,831,007 B2
(45) Date of Patent: Nov. 28, 2017

(54) RADIOGRAPHIC FLAT PANEL DETECTOR HAVING A FERROMAGNETIC LAYER AND THE METHOD OF PRODUCTION THEREOF

(71) Applicant: Agfa HealthCare NV, Mortsel (BE)

(72) Inventors: Paul Leblans, Mortsel (BE); Luc Struye, Mortsel (BE); Ilse Mans, Mortsel (BE); Sabina Elen, Mortsel (BE)

(73) Assignee: AGFA HEALTHCARE NV, Mortsel (BE)

( * ) Notice: Subject to any disclaimer, the term of this patent is extended or adjusted under 35 U.S.C. 154(b) by 0 days.

(21) Appl. No.: 15/303,757

(22) PCT Filed: Apr. 17, 2015

(86) PCT No.: PCT/EP2015/058365
§ 371 (c)(1),
(2) Date: Oct. 13, 2016

(87) PCT Pub. No.: WO2015/165754
PCT Pub. Date: Nov. 5, 2015

(65) Prior Publication Data
US 2017/0040078 A1 Feb. 9, 2017

(30) Foreign Application Priority Data
Apr. 28, 2014 (EP) .................... 14166151

(51) Int. Cl.
*G01T 1/10* (2006.01)
*G21K 4/00* (2006.01)
(Continued)

(52) U.S. Cl.
CPC ............. *G21K 4/00* (2013.01); *B05D 5/00* (2013.01); *B05D 5/063* (2013.01); *B05D 7/5483* (2013.01);
(Continued)

(58) Field of Classification Search
CPC . G21K 4/00; B05D 3/12; C09K 11/02; C09K 11/55; C09K 11/628;
(Continued)

(56) References Cited

U.S. PATENT DOCUMENTS 2,694,153 A 11/1954 Reuter
3,817,356 A * 6/1974 Dahlquist ............... F16F 9/306
188/268

(Continued)

FOREIGN PATENT DOCUMENTS

BE EP 2921881 A1 * 9/2015 ........... G03B 42/023
EP 0 098 574 A2 1/1984
(Continued)

OTHER PUBLICATIONS

Official Communication issued in International Patent Application No. PCT/EP2015/058365, dated Jun. 23, 2015.

*Primary Examiner* — Taeho Jo
(74) *Attorney, Agent, or Firm* — Keating and Bennett, LLP (57) ABSTRACT

A radiographic flat panel detector includes a layer configuration in the order given: a) a radiation transparent substrate; and b) a scintillator layer applied by vapor deposition on the radiation transparent substrate; and c) an imaging array between the scintillator layer and a second substrate, characterized in that the radiation transparent substrate has on a side a layer including magnetisable particles and a method for producing the radiographic flat panel detector.

6 Claims, 5 Drawing Sheets

(51) Int. Cl.

| | | |
|---|---|---|
| *C09K 11/61* | (2006.01) | |
| *G01T 1/202* | (2006.01) | |
| *B05D 5/00* | (2006.01) | |
| *B05D 5/06* | (2006.01) | |
| *B05D 7/00* | (2006.01) | |
| *B32B 7/12* | (2006.01) | |
| *B32B 27/28* | (2006.01) | |
| *B32B 27/32* | (2006.01) | |
| *B32B 27/36* | (2006.01) | |
| *B32B 37/12* | (2006.01) | |
| *B32B 37/18* | (2006.01) | |
| *C23C 16/30* | (2006.01) | |
| *C23C 16/448* | (2006.01) | |

(52) U.S. Cl.
CPC .............. *B32B 7/12* (2013.01); *B32B 27/281* (2013.01); *B32B 27/285* (2013.01); *B32B 27/286* (2013.01); *B32B 27/32* (2013.01); *B32B 27/325* (2013.01); *B32B 27/36* (2013.01); *B32B 37/1207* (2013.01); *B32B 37/18* (2013.01); *C09K 11/616* (2013.01); *C23C 16/30* (2013.01); *C23C 16/448* (2013.01); *G01T 1/202* (2013.01); *B32B 2037/1215* (2013.01); *B32B 2255/10* (2013.01); *B32B 2255/205* (2013.01); *B32B 2255/28* (2013.01); *B32B 2307/208* (2013.01); *B32B 2323/00* (2013.01); *B32B 2323/04* (2013.01); *B32B 2367/00* (2013.01); *B32B 2371/00* (2013.01); *B32B 2379/08* (2013.01); *B32B 2535/00* (2013.01); *G21K 2004/04* (2013.01); *G21K 2004/06* (2013.01); *G21K 2004/12* (2013.01)

(58) Field of Classification Search
CPC ..... C09K 11/7771; B32B 15/08; B32B 15/20; B32B 2038/0024; B32B 2255/00; B32B 2262/106; B32B 2307/416; B32B 2307/422; B32B 2307/54; B32B 2309/02; B32B 2311/24; B32B 2398/20; B32B 2457/00; B32B 2551/00; B32B 27/08; B32B 27/20; B32B 27/281; B32B 27/286; B32B 27/30; B32B 27/32; B32B 27/36; B32B 27/365; B32B 37/02; B32B 3/14; B32B 41/00; B32B 7/02; C23C 14/0694
USPC ...................................... 250/361 R
See application file for complete search history.

(56) References Cited

U.S. PATENT DOCUMENTS

| | | | | |
|---|---|---|---|---|
| 6,808,806 | B2* | 10/2004 | Phillips | B05D 5/061 106/456 |
| 7,304,309 | B2* | 12/2007 | Suhami | B82Y 20/00 250/370.11 |
| 2002/0182383 | A1* | 12/2002 | Phillips | C08J 7/04 428/199 |
| 2003/0165637 | A1* | 9/2003 | Phillips | B42D 25/42 427/598 |
| 2004/0150311 | A1* | 8/2004 | Jin | H01J 1/304 313/309 |
| 2005/0139783 | A1* | 6/2005 | Kubota | G03B 42/08 250/484.4 |
| 2006/0202125 | A1* | 9/2006 | Suhami | B82Y 20/00 250/368 |
| 2006/0289770 | A1* | 12/2006 | Andou | G03B 42/04 250/362 |
| 2008/0245968 | A1* | 10/2008 | Tredwell | G01T 1/2018 250/370.09 |
| 2008/0284868 | A1* | 11/2008 | Kerr | H04N 5/2354 348/222.1 |
| 2010/0118243 | A1* | 5/2010 | Majumdar | H01L 51/0021 349/122 |
| 2011/0151153 | A1* | 6/2011 | Felder | C08L 65/00 428/32.86 |
| 2012/0038532 | A1* | 2/2012 | Yonetsu | B22F 1/0062 343/787 |
| 2014/0239196 | A1* | 8/2014 | Shoji | G01T 1/202 250/488.1 |
| 2014/0295342 | A1* | 10/2014 | Ishikawa | G03G 9/1132 430/111.3 |
| 2015/0185334 | A1* | 7/2015 | Tredwell | G01T 1/161 250/366 |
| 2016/0209483 | A1* | 7/2016 | Moskal | G01R 33/481 |

FOREIGN PATENT DOCUMENTS

| | | | |
|---|---|---|---|
| EP | 0 099 054 A2 | 1/1984 | |
| EP | 1 630 260 A2 | 3/2006 | |
| EP | 1 630 261 A2 | 3/2006 | |
| EP | 1 997 866 A1 | 12/2008 | |
| JP | EP 0099054 A2 * | 1/1984 | ............ B65H 5/021 |
| JP | 2004-018938 A | 1/2004 | |
| JP | 2006-010616 A | 1/2006 | |
| JP | 2006-219516 A | 8/2006 | |
| WO | 2010/023969 A1 | 3/2010 | |
| WO | 2014/039765 A1 | 3/2014 | |

* cited by examiner

RADIOGRAPHIC FLAT PANEL DETECTOR HAVING A FERROMAGNETIC LAYER AND THE METHOD OF PRODUCTION THEREOF

CROSS REFERENCE TO RELATED APPLICATIONS

This application is a 371 National Stage Application of PCT/EP2015/058365, filed Apr. 17, 2015. This application claims the benefit of European Application No. 14166151.2, filed Apr. 28, 2014, which is incorporated by reference herein in its entirety.

BACKGROUND OF THE INVENTION

1. Field of the Invention

The present invention relates to diagnostic imaging and more particularly, to a radiographic X-ray detector and methods of making them.

2. Description of the Related Art

X-ray imaging is a non-invasive technique to capture medical images of patients or animals as well as to inspect the contents of sealed containers, such as luggage, packages, and other parcels. To capture these images, an X-ray beam irradiates an object. The X-rays are then attenuated as they pass through the object. The degree of attenuation varies across the object as a result of variances in the internal composition and/or thickness of the object. The attenuated X-ray beam impinges upon an X-ray detector designed to convert the attenuated beam to a usable shadow image of the internal structure of the object.

Increasingly, radiographic flat panel detectors (RFPDs) are being used to capture images of objects during inspection procedures or of body parts of patients to be analyzed. The RFPDs have a scintillator layer such as CsI:Tl or $Gd_2O_2S$ which converts X-rays into light which then interacts with an amorphous silicon (a-Si) semiconductor layer, where electric charges are created.

The created electric charges are collected via a switching array, comprising thin film transistors (TFTs). The transistors are switched-on row by row and column by column to read out the signal of the detector. The charges are transformed into voltage, which is converted in a digital number that is stored in a computer file which can be used to generate a softcopy or hardcopy image. Recently Complementary Metal Oxides Semiconductors (CMOS) sensors are becoming important in X-ray imaging. The detectors based on CMOS are already used in mammography, dental, fluoroscopy, cardiology and angiography images. The advantage of using those detectors is a high readout speed and a low electronic noise. Generally, the imaging array including TFTs as switching array and photodiodes is deposited on a substrate of glass.

One way of producing scintillator layers with high image resolution is by vapour deposition of scintillators onto a radiation transparent substrate. Scintillator layers consisting of needle crystallites are particularly suitable to be deposited by vapour deposition. Using thin radiation transparent substrates has the advantage of weight reduction and cost reduction in both Computer Radiography (CR) systems and RFPD's. The cost of thin radiation transparent substrates is lower in comparison with commonly used plates based on metal or reinforced plastic. Additionally in RFPD's a good contact between the scintillator layer and the sensor or imaging array is required to obtain good optical coupling leading to a high image quality. This good optical coupling can be achieved when scintillator layers are deposited on thin radiation transparent substrates which are flexible. The flexibility of the radiation transparent substrate and the flexibility of the scintillator layer guarantee a good contact between the scintillator and the sensor. It is further advantageous to have a thin radiation transparent substrate to minimise the weight of the substrate and hence the weight of radiographic flat panel detector. A low weight is mandatory for the portability of RFPD's. In the medical field, these X-ray detectors have to be carried around by the medical staff and any weight reduction is, therefore, beneficial for the user of the detector. Another advantage of using thin radiation transparent substrates in the production of scintillators for radiographic flat panel detectors is the reduced absorption of X-rays by the substrate with respect to normal or thick substrates since the exposure of the scintillator to radiation is done mostly through the substrate.

The fixation of large and thin radiation transparent substrates during the vapour deposition of scintillator layers and more specifically, needle scintillators is difficult. Indeed, it is then hard to obtain a flat radiation transparent substrate to guarantee a homogeneous layer deposition. Furthermore, it is almost impossible to handle vapour deposited layers on thin and hence flexible radiation transparent substrates without damaging the scintillator layer or without delaminating the scintillator layer from the substrate. This is even more pronounced in case of needle scintillators.

JP2006010616A discloses a manufacturing method of a radiation image transformation panel. In this manufacturing method a layer which contains magnetic material is provided between support holder and the photostimulable phosphor layer. The layer which contains magnetic material is made of ferrite magnets or rubber magnets which are thick layers and which are not very compatible with thin substrates. Thin magnetic films can be applied via the gaseous phase deposition but this is an expensive method and suffers from the same problem related to the difficult handling of thin substrates when thin substrates would be used. Moreover, the presence of magnetic material on the substrate of a scintillator, once built in a RFPD, can be disadvantageous due to the interaction between the magnetic field from the magnetic material and the electronic components of the sensor.

JP2004018938A discloses a deposition method of phosphor layers onto a substrate, using magnetic attraction power between the substrate supporting part and the substrate. This is realised by providing a magnetic layer on the side of the substrate opposite to the side which has to be covered by a phosphor layer. The substrate consists of an inorganic material such as glass or silicon. Due to the high stiffness of these substrates, a good coupling between the scintillator layer and the sensor, a TFT, is very difficult to achieve. Moreover, the presence of magnetic material on the substrate of a scintillator, once built in a RFPD, can be disadvantageous due to the interaction between the magnetic field from the magnetic material and the electronic components of the JP2006219516A discloses a manufacturing method of a radiological image conversion panel holding a substrate, preferably Aluminium by an electrostatic chucking function of a substrate holder, and vapour-depositing a centre or the whole surface of this substrate. The substrate holder requires still metal fittings to fix the edges of the substrate against the surface of the substrate holder. These metal fittings cause irregular deposition of phosphor layers at the edges of the substrate.

EP1630260 discloses a magnetic latch for securing substrates on a planetary rotating platform suspended above a coating source in a vacuum chamber of vapour deposition systems. The magnetic latch includes a permanent magnet, which is moveable between a latching position, in which the permanent magnet magnetizes temporarily the latch for attracting a substrate holder, and an unlatching position, in which the permanent magnet is connected in a bypass circuit, thereby demagnetizing the latch for releasing the substrate holder.

EP1630261 discloses a partially disposable substrate holder used in magnetic latches for securing substrates on a planetary rotating platform suspended above a coating source in a vacuum chamber of vapour deposition systems. The substrate holder includes a reusable base formed, at least partially, from a ferromagnetic material, which is attracted to the magnetic latch, and a disposable cover formed from a relatively inexpensive, ferromagnetic, easily formable material, which encourages adherence of coating material and has a low vapour pressure at coating temperatures.

WO10023969A describes a radiation image conversion panel which can be transported avoiding contact between the phosphor layer and the rollers of the transport system. On one side of the panel, a ferromagnetic layer is provided to assure a magnetic attraction power with magnetic conveyor rolls. The phosphor layer is applied via a coating from a coating solution containing also a binder. This results in a phosphor layer which is not easily damaged and where good contact with the image sensor can be achieved.

U.S. Pat. No. 2,694,153 discloses an X-ray intensifying screen which has a support which responds to the effect of a magnetic field. This response is used to bring the intensifying screen into intimate and uniform contact with an X-ray sensitive film. The support may contain a layer of finely divided particles of magnetizable material in a film forming binding agent. The layer of magnetizable material is not used in a vapour deposition process during the production of the X-ray intensifying screen.

None of these documents describe a method of vapour depositing a scintillator layer on thin substrates acting as radiation transparent substrates, which guarantees a perfect fixation over the whole surface of the substrate against the substrate holder, without requiring substrate holders having metal latches or movable parts to fix the substrate so as to obtain a good adhesion between the scintillator layer and the radiation transparent substrate and which do not require thick layers with magnetic material onto the substrate. Thin substrates are very preferably required to reduce the absorption of X-rays in a RFPD. It is also desirable to have a method of producing substrates suitable for vapour deposition of layers in an economical efficient way. It is furthermore desired to have a method for producing scintillator layers on radiation transparent substrates which have a low weight and which at the same time can serve as ESD (Electrostatic Discharge) shield in a radiographic flat panel detector.

SUMMARY OF THE INVENTION

The above stated problems are solved by the radiographic flat panel detector (RFPD) comprising a radiation transparent substrate having a layer comprising magnetizable particles as defined below.

The above stated problems are solved by the method as also defined below. This method is based on the use of substrates having a layer comprising magnetizable particles. These substrates can then be fixed to the surface of a substrate supporting body by means of magnetic attraction forces during the vapour deposition of scintillator layers.

Further preferred embodiments of the invention are described below.

Other advantages of the present invention will become more apparent from the following detailed description of preferred embodiments of the present invention. Specific preferred embodiments of the invention are also defined in the dependent claims.

BRIEF DESCRIPTION OF THE DRAWINGS

FIG. 2 represents a cross-section of a RFPD according to one preferred embodiment of the present invention, wherein:
    201 is a layer comprising magnetizable particles
    202 is a radiation transparent substrate
    203 is a scintillator layer
    204 is an imaging array
    205 is a second substrate
    206 is a light reflecting layer
FIG. 3 represents a cross-section of a RFPD according to one preferred embodiment of the present invention, wherein:
    301 is a layer comprising magnetizable particles
    302 is a radiation transparent substrate
    303 is a scintillator layer
    304 is an imaging array
    305 is a second substrate
    307 is a hot melt resin layer
FIG. 4 represents a cross-section of a RFPD according to one preferred embodiment of the present invention, wherein:
    401 is a layer comprising magnetizable particles
    402 is a radiation transparent substrate
    403 is a scintillator layer
    404 is an imaging array
    405 is a second substrate
    406 is a light reflecting layer
    407 is a hot melt resin layer
FIG. 6 represents a cross-section of a RFPD according to one preferred embodiment of the present invention, wherein:
    601 is a layer comprising magnetizable particles
    602 is a radiation transparent substrate
    603 is a scintillator layer
    604 is an imaging array
    605 is a second substrate
    606 is a light reflecting layer
    607 is a hot melt resin layer
    608 is an X-ray shield
FIG. 7 represents a cross-section of a RFPD according to one preferred embodiment of the present invention, wherein:
    701 is a layer comprising magnetizable particles
    702 is a radiation transparent substrate
    703 is a scintillator layer
    704 is an imaging array
    705 is a second substrate 706 is a light reflecting layer
707 is a hot melt resin layer
709 is an adhesion promoting layer
FIG. 8 represents a cross-section of a RFPD according to one preferred embodiment of the present invention, wherein:
801 is a layer comprising magnetizable particles
802 is a radiation transparent substrate
803 is a scintillator layer
804 is an imaging array
805 is a second substrate
806 is a light reflecting layer
807 is a hot melt resin layer
809 are adhesive layers

DETAILED DESCRIPTION OF THE PREFERRED EMBODIMENTS

Preparation of the Layer Comprising Magnetizable Particles.

The layer comprising magnetizable particles which is to be used in preferred embodiments of the present invention, is hereafter denoted as a ferromagnetic layer. The ferromagnetic layer can be applied by different methods known in the art, such as Physical Vapour Deposition (PVD), Chemical Vapour Deposition (CVD), sputtering and wet coating methods such as knife coating, doctor blade coating, screen printing, sedimentation, spin-coating, and dip-coating. The most preferable methods are knife coating and doctor blade coating. The wet coating methods comprise the coating of a coating dispersion which is a mixture of a solvent, a binder and magnetizable particles.

Suitable magnetizable material includes particles of Fe, Ni, Co, alloys thereof, iron oxide, and chromium dioxide. The size of the particles is preferably lower than 50 µm, more preferably lower than 10 µm.

Suitable solvents for preparing the coating dispersion are acetone, hexane, methyl acetate, ethyl acetate, isopropanol, methoxy propanol, isobutyl acetate, ethanol, methanol, methylene chloride and water. More preferably, toluene, methyl-ethyl-ketone (MEK), methyl cyclohexane and any of their mixtures are used.

Binders to be used in coating dispersions can be polyethylene glycol acrylate, acrylic acid, butenoic acid, propenoic acid, urethane acrylate, hexanediol diacrylate, copolyester tetracrylate, methylated melamine, ethyl acetate, methyl methacrylate. Preferred binders are organic polymers: cellulose acetate butyrate, polyalkyl (meth)acrylates, such as polymethyl methacrylate, a polyvinyl-n-butyral, a poly(vinylacetate-co-vinylchloride) and a poly(acrylonitrile-co-butadiene-co-styrene) or a poly(vinyl chloride-co-vinyl acetate-co-vinyl alcohol), or mixture thereof. Preferably the binder comprises one or more hydrogenated styrene-diene block copolymers, having a saturated rubber block, as rubbery and/or elastomeric polymer. Particularly suitable thermoplastic rubbers in accordance with this invention are the KRATON-G rubbers, KRATON being a trade mark name from SHELL.

The weight ratio of magnetizable material to binder is from 80:20 to 99:1, more preferably form 94:6 to 98:2.

In another preferred embodiment of the invention other than knife or doctor blade coatings can be used. In a screen printing process, the layer is formed by pressing the coating dispersion through a mesh onto the substrate. In a sedimentation process, the layer is formed from a dispersion applied onto the substrate and where the particles are settled down onto the substrate. In the spin-coating process, the layer is formed from a coating dispersion which is placed in a small amount at the centre of the substrate. The substrate is then rotated with high speed and the dispersion is spread over the whole area by centrifugal force. In the dip-coating process, the layer is formed by immersion of substrate into the coating dispersion and subsequent pulled out at a constant speed.

Coating is an economically efficient technique of applying one or more layers onto a substrate. Flexible substrates are particularly suitable for a continuous coating process. Flexible substrates can be available as rolls and they can be wound and un-wound in the production process of coating and drying or curing. Besides flexible substrates, thin substrates are also particularly suitable for a continuous coating process.

After the coating from a coating dispersion, the ferromagnetic layer can be dried via an IR-source, an UV-source, a heated metal roller or heated air. When curable monomers are used in the coating solution, the coated layer can be cured via heating or via an UV-source. After drying or curing, the substrate coated with a ferromagnetic layer can be cut into sheets of appropriate size to match with the vapour deposition apparatus used for the vapour deposition of the scintillator layer.

Applying magnetizable particles via a wet coating technique including a polymeric binder has the advantage that the magnetizable particles which can be deteriorated due to interaction with oxygen and water from the air are protected by the polymeric binder.

Another preferred method of applying magnetizable particles is by means of PVD. The ferromagnetic layer can be deposited in vacuum from the gas phase obtained by melting magnetizable precursor raw material. This raw material can be introduced in a heat resistive container, called crucible to be heated to a temperature equal to or higher than the melting point of compound(s). The crucible and substrate are therefore introduced in a vapour deposition vacuum chamber. The raw material can also be introduced as a slag or plate which is melted with electron beam irradiation. The melted material vaporizes and condenses onto the substrate.

In a CVD process, the layer is formed via chemical reactions of molecules from gaseous phase which are then deposited on a surface. In the reactor chamber a substrate may be kept at elevated temperature and the gas of the products is introduced. The particles diffuse and adsorb onto the heated surface, where they rearrange before the final surface reaction takes place. This leads to the film formation. At the same time the by-products are desorbed from surface and diffuse in a carrier gas and are removed from the reaction zone.

In a sputtering or atomisation process, the layer is formed by ejection of atoms or particles from a solid target by the impact of highly energetic particles. The target of the material is eroded and the atoms or particles due to the energy transfer are flying in the direction of the substrate where they are deposited.

Figure 1:
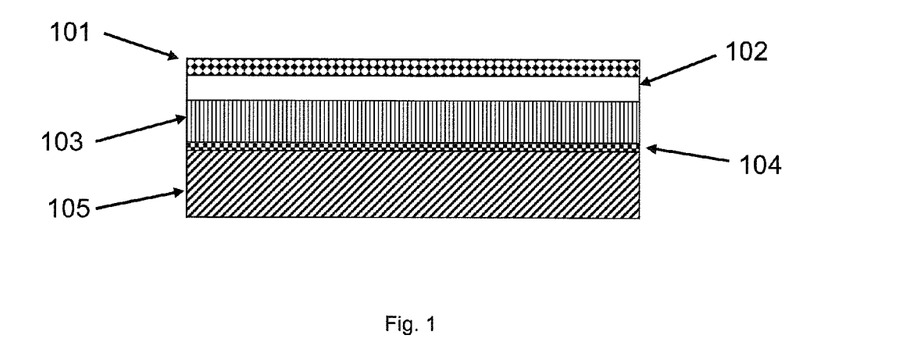
FIG. 1 represents a cross-section of a RFPD according to one preferred embodiment of the present invention, wherein:
    101 is a layer comprising magnetizable particles
    102 is a radiation transparent substrate
    103 is a scintillator layer
    104 is an imaging array
    105 is a second substrate
Figure 2:
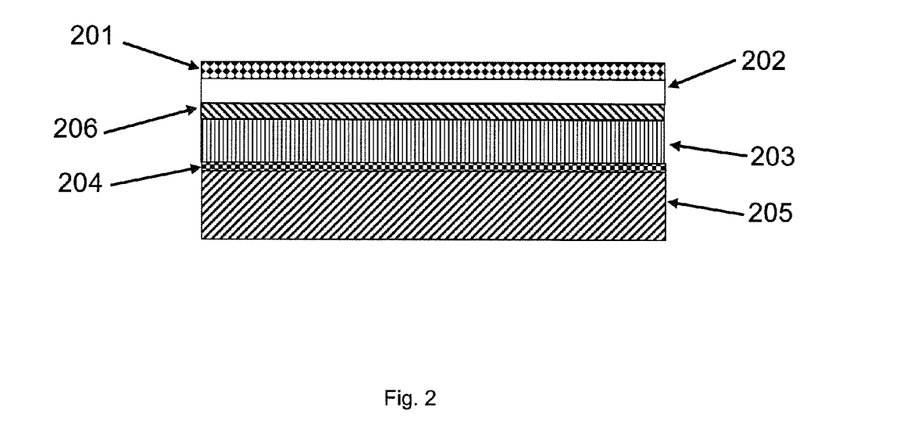
Figure 3:
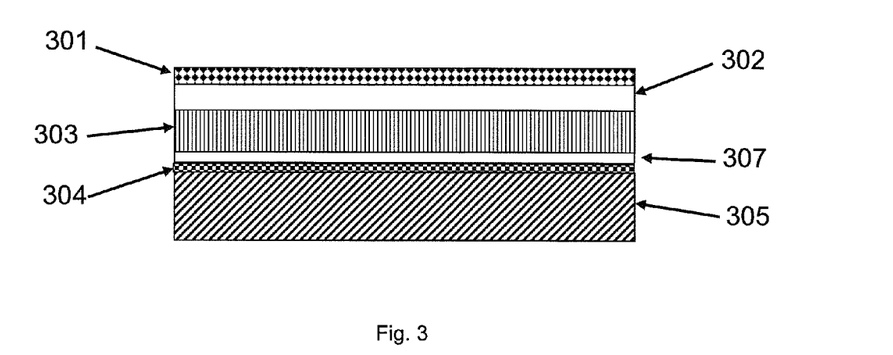
Figure 4:
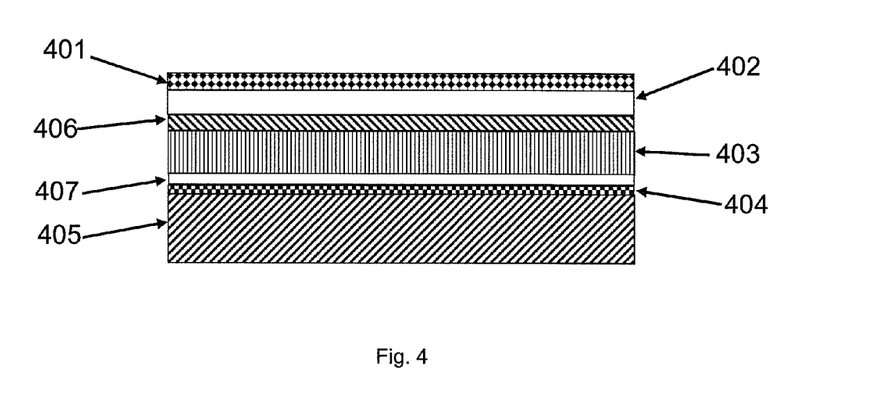
Figure 5:
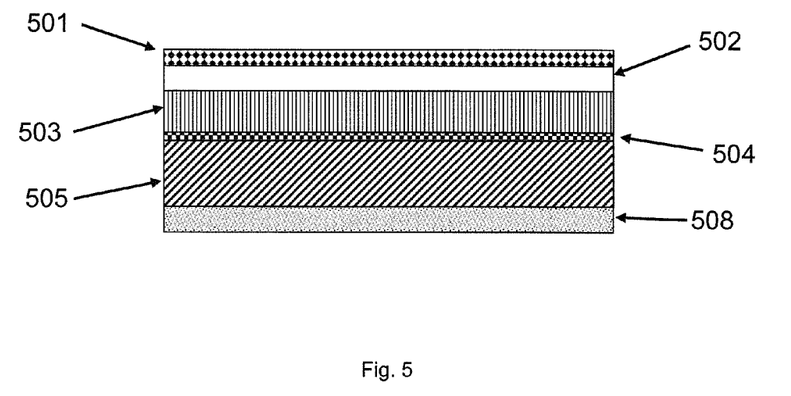
FIG. 5 represents a cross-section of a RFPD according to one preferred embodiment of the present invention, wherein:
    501 is a layer comprising magnetizable particles
    502 is a radiation transparent substrate
    503 is a scintillator layer
    504 is an imaging array
    505 is a second substrate
    508 is an X-ray shield
Figure 6:
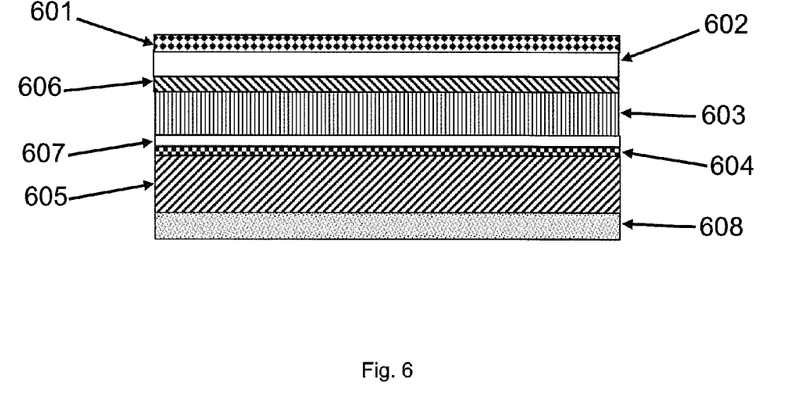
Figure 7:
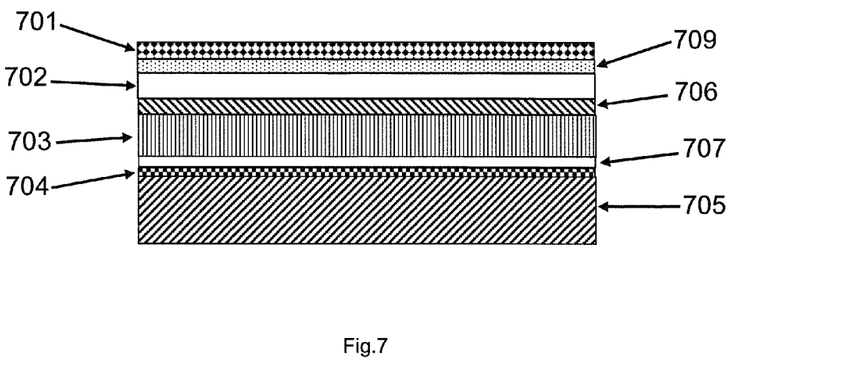
Figure 8:
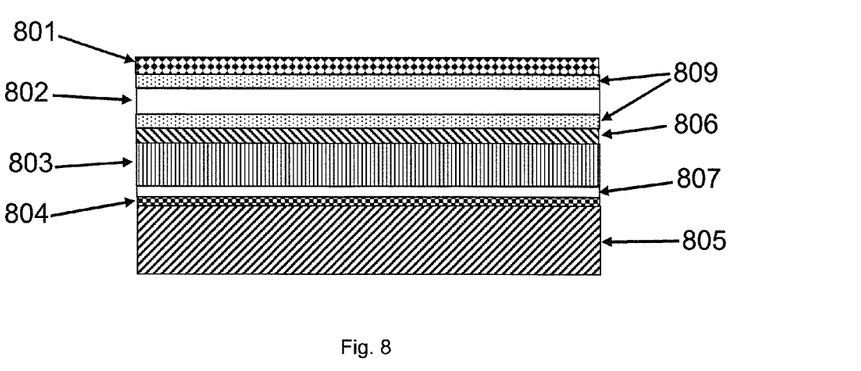
Figure 9:
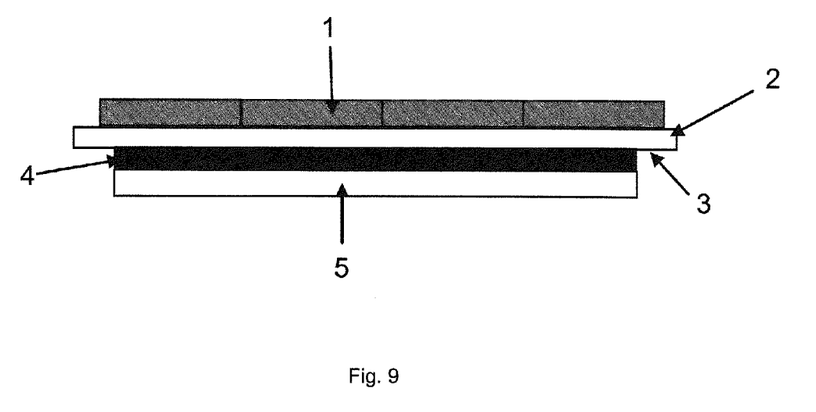
FIG. 9: Schematic representation of a preferred embodiment of the present invention for vapour depositing a scintillator layer comprising a substrate supporting body having magnet(s) on a side of the rigid plate with a substrate having a layer comprising magnetizable particles (ferromagnetic layer) attracted to the surface of the substrate supporting body wherein:
1 is (are) magnet(s)
2 is a rigid plate
3 is a surface
1, 2 and 3 together are the substrate supporting body
4 is a layer comprising magnetizable particles (ferromagnetic layer) on a side of the radiation transparent substrate
5 is radiation transparent substrate on which a scintillator layer is to be deposited.
Figure 10:
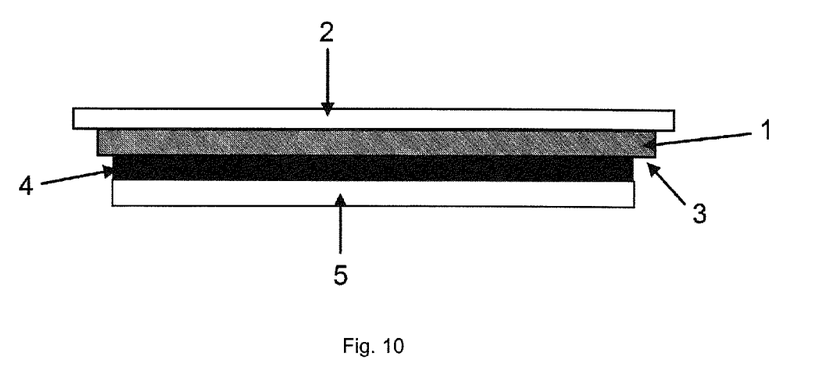
FIG. 10: Schematic representation of a preferred embodiment of the present invention for vapour depositing a scintillator layer comprising a substrate supporting body having magnet(s) on a side of the rigid plate with a radiation transparent substrate having a layer comprising magnetizable particles (ferromagnetic layer) attracted to the surface of the substrate supporting body wherein:
1 is (are) magnets
2 is a rigid plate
3 is a surface
1, 2 and 3 together are the substrate supporting body
4 is a layer comprising magnetizable particles (ferromagnetic layer) on a side of the radiation transparent substrate
5 is the substrate on which a scintillator layer is to be deposited.

Optionally, before applying a ferromagnetic layer an adhesion promoting layer can be applied on a side of the substrate, to improve the adhesion between the ferromagnetic layer and the substrate (see FIGS. 7 and 8). Adhesion promoting layers are preferably based on copolyesters or polyurethanes. Other examples of adhesion promoting layers can be found in EP1997866A and in unpublished application EP13197736.5.

The ferromagnetic layer has a thickness preferably in the range from 10 to 300 µm, more preferably from 20 to 300 µm and most preferably from 30 to 100 µm. The coating weight of the ferromagnetic layer is preferably between 10 and 100 mg/cm$^2$.

The Radiation Transparent Substrate

The method of vapour deposition of scintillators is particularly useful for deposition on thin substrates. The radiation transparent substrates to be used in a radiographic flat panel detector are preferably thin to minimise the absorption of X-rays since the X-rays travel through this radiation transparent substrate before reaching the scintillator. With thin substrates is meant, substrates having a thickness between 20 and 300 µm, preferably between 70 and 200 µm. The thin substrate for the phosphor or scintillator, can be either rigid or flexible, such as an aluminium plate, an aluminium foil, a film of polyethylene terephthalate (PET), polyethylene naphthalate (PEN), polyimide (PI), polyethersulphone (PES), polyphenylsulfone (PPSU), polyphenylene sulphide (PPS), polyether etherketon (PEEK), polybutylene terephthalate (PBT), polyetherimide (PEI), a metal foil, a carbon fibre reinforced plastic (CFRP) sheet, glass, flexible glass, triacetate and a combination thereof or laminates thereof.

More preferable substrates are flexible substrates: metal foils, especially of aluminium, foils of polyethylene terephthalate (PET), polyethylene naphthalate (PEN), polyimide (PI), polyethersulphone (PES), polyphenylsulfone (PPSU), polyphenylene sulphide (PPS) and combinations thereof or laminates thereof. The thickness of the flexible substrates is between 20 and 300 µm, preferably between 70 and 200 µm. The flexibility of the substrate guarantees a good optical coupling between the scintillator layer and the imaging array comprising photoelectric conversion elements in a direct digital radiographic flat panel detector. Indeed the imaging array comprises photoelectric conversion elements which represent height variations within the plane formed by the imaging array. Due to these height variations, air gaps can exist between the scintillator and the imaging array if the radiation transparent substrate is not flexible and extra reflections can occur leading to a reduced image quality.

Furthermore, in case optical coupling is performed by means of heating, the expansion and shrinkage of the supporting substrate (second substrate) of the imaging array is more easily compensated by a thin substrate which follows the movement of the supporting substrate than by a stiff thick substrate and will not cause a deformation of the imaging array and avoid subsequent damage to the imaging array. Another advantage of flexible substrates is the economical way by which the ferromagnetic layer and additional layers such as adhesion layers, light reflecting layers can be applied.

Due to the elevated temperature of the substrate during the vapour deposition step, the substrate is preferably thermostable and/or thermally stabilized. With the terms thermostable and thermally stabilized is meant, the resistance of the material of the substrate to irreversible changes in its chemical or physical structure at the elevated temperature during the vacuum deposition process.

It is also preferred that the thermal expansion coefficient of the substrate is $100 \cdot 10^{-6}$ m/° C. or lower, preferably $40 \cdot 10^{-6}$ m/° C. or lower.

Pre-coats

Optionally, layers can be applied between the radiation transparent substrate and the vapour deposited scintillator layers. These layers, hereafter denoted as pre-coats, can improve the adhesion of the deposited scintillator layers to the substrate (see FIG. 8). Other functionalities of pre-coats can be reflecting or absorbing or shifting the spectrum of the light emitted light by the scintillator to avoid image artefacts or to improve sensitivity or to match better with the sensitivity of the detector (see FIGS. 2, 4, 6, 7 and 8). Because the radiation transparent substrates are thin and hence flexible, they are very suitable for applying these pre-coats by a coating method prior to the vapour deposition. Coating is an economically efficient technique of application of one or more layers onto a substrate. By means of coating techniques more than one pre-coat can be applied. Flexible substrates are particularly suitable for a continuous coating process. Moreover, flexible substrates can be available as rolls and they can be wound and un-wound in the production process of coating and drying or curing.

Light reflecting layers comprise preferably $TiO_2$ and are used to reflect 90% or more light at the wavelength(s) of the light emitted by the scintillator. The solid content of $TiO_2$ in the light reflecting layer is preferably in the range of 25 to 50 (wt.) %. and the thickness is preferably in the range of 5 to 40 µm. More preferably, the solid content of the $TiO_2$ is 33 to 38 (wt.) % of the total solid content of the layer and the layer thickness is between 13 and 30 µm. Other examples of suitable layers can be found in EP1997866A and in unpublished application EP13197736.5.

The pre-coats can be applied onto a side of the substrate before, during or after the application of the ferromagnetic layer. They can be applied on any side of the substrate (see FIG. 8). The light reflecting layers are applied preferably on the side opposite to the side having the ferromagnetic layer and more preferably between the radiation transparent substrate and the scintillator layer (see FIGS. 2, 4, 6, 7 and 8)

The Substrate Supporting Body

The substrate supporting body to be used in a preferred method of the present invention is placed in a vapour deposition vacuum chamber. The substrate supporting body comprises a surface which is preferably smooth to guarantee a good adhesion over the whole surface of the radiation transparent substrate having a ferromagnetic layer on a side of the substrate during the vapour deposition step. With a smooth surface is meant, a surface which is not rough or which does not have any defects such as bumps, ridges, or uneven parts. If the surface of the substrate supporting body is not smooth, every defect in the surface will be visible in the scintillator or phosphor layer. This smooth surface can be obtained by means of a rigid plate or block of material consisting of glass, ceramics, aluminium, permanent magnetic material such a magnetic rubber foils of flexible magnetic material fixed to the rigid plate or block. The surface of the substrate supporting body can be polished to further improve adhesion of the substrate and improve the homogeneous deposition of the scintillator layer. In another preferred embodiment of the invention, the plate or block can also been made of permanent magnetic material such as ferrite, Samarium-Cobalt alloys, Aluminium-Nickel-Cobalt alloys and Neodymium-Iron-Boron. Preferably magnetic materials which are resistant to high temperatures such as Samarium -Cobalt and Aluminium-Nickel-Cobalt alloys are suitable. In another preferred embodiment, one or more permanent magnets can be glued to the rigid plate with a glue, more preferably a heat resistant glue, on a side of the rigid plate opposite to the side to which the substrate is adhered during the vapour deposition. It is possible to use several groups of magnets glued to the substrate supporting body in order to obtain a large and homogeneous magnetic field to guarantee a strong magnetic attraction of the radiation transparent substrate having a ferromagnetic layer.

The substrate supporting body may also comprise electromagnets which are able to magnetize the block or rigid plate forming the surface to which the substrate is attracted or which are able to attract the radiation transparent substrate having a ferromagnetic layer. One of the advantages of electromagnets is that electromagnets do not lose their magnetic properties upon heating during the vapour deposition process.

The substrate supporting body can be rotated with the rotation axis perpendicular to the substrate. The substrate supporting body can be heated to a temperature of 250° C. more preferably to 160° C.

Process for Producing a Scintillator Layer by Vapour Deposition.

A method according to a preferred embodiment of the present invention includes a deposition step of scintillator layers on the radiation transparent substrate, by a method selected from the group consisting of physical vapour deposition, chemical vapour deposition and vapour deposition by means of a sputtering technique. The scintillating layers can be deposited on any of the two sides of the substrate, but preferably on the side opposite to the ferromagnetic layer. Preferably, scintillator layers are deposited on the pre-coats.

Apparatus

The radiation transparent substrate having a ferromagnetic layer and obtained as described above is contacted with a side to the surface of the substrate supporting body. Preferably, the side of the radiation transparent substrate covered with the ferromagnetic layer is contacted with the surface of the substrate supporting body. If electromagnets are used to magnetize the substrate supporting body, the current supply should be switched on. The radiation transparent substrate is attracted to the substrate supporting body and by its flat surface, a good adhesion between the substrate supporting body and the substrate is assured. The side of the radiation transparent substrate on which scintillator layers have to be deposited is preferably directed to the source of the vapour.

In a vapour deposition apparatus which can be used according to the present invention, a container or crucible is provided in which scintillator precursor raw materials can be heated. The crucible has bottom and side walls, and can be heated (in the range up to 700 preferably up to 900° C.) in order to vaporise the scintillator precursor raw materials and deposit it onto the radiation transparent substrate. Heating of the crucibles can be done by resistive heating, induction heating or by means of lamps, preferably IR heaters.

The distance between the crucible(s) and the radiation transparent substrate is preferably in the range of from 10 cm to 60 cm and even more preferred from 10 cm to 30 cm. A too large distance leads to considerable loss of material and decreased yield of the process, whereas a too small distance leads to a too high temperature of the substrate and heterogeneously deposited layers. Measures in order to avoid an increase of the temperature of the substrate have e.g. been described in U.S. Pat. No. 6,720,026.

The substrate supporting body and the crucibles are incorporated in a vacuum deposition chamber which allows reducing the pressure in the range from $10^{-5}$ to 1 Pa.

Vapour Deposition of the Scintillator Layer.

A method according to a preferred embodiment of the present invention provides preparing a scintillator layer on a radiation transparent substrate obtained as described above by heating in one or more crucibles scintillator precursor raw materials. These scintillator precursor raw materials comprise matrix compounds and activator and/or dopant precursor compounds. The precursor raw materials are heated at least up to the melting point and the layers are formed by condensation of the evaporated material.

Suitable matrix compounds are alkali halides (MX, where M represents alkali metals such as lithium (Li), sodium (Na), potassium (K), rubidium (Rb), caesium (Cs) and X represents halides such as fluoride (F), chloride (Cl), bromide (Br), iodide (I). The dopant is preferably a lanthanide salt, more preferably a lanthanide halide.

Examples of scintillators which can be vapour deposited are: caesium iodide doped with thallium (CsI:Tl), caesium iodide doped with sodium (CsI:Na), caesium iodide doped with europium (CsI:Eu), strontium iodide doped with europium ($SrI_2$:Eu), (earth) alkali metal halides (MX:D, where M represents alkali metals: lithium (Li), sodium (Na), potassium (K), rubidium (Rb), caesium (Cs) or earth alkali metals: beryllium (Be), magnesium (Mg), calcium (Ca), strontium (Sr), barium (Ba), X represents halides: fluoride (F), chloride (Cl), bromide (Br), iodide (I), D represents a dopant for example thallium (Tl). Other scintillators such as gallium selenide (GaSe) are made by CVD, methods of making thin films of cadmium sulphide (CdS) are described in Solar Energy Materials and Solar Cells 75 (1-2): 219, and of cadmium tungstate (CdWO4) in Nuclear Instruments and Methods in Physics Research A 369 (1996) 164-168. The method of growing layers of zinc cadmium sulphide $Zn_xCd_{(1-x)}S$ scintillators are found in Journal of Crystal Growth Volume 96, Issue 4, August 1989, Pages 989-992.

The scintillator precursor raw material(s) can be present in the same crucible or divided into two or more crucibles with a different ratio in weight of raw materials. For example one crucible with a predominant or even an exclusive amount of the matrix compound as e.g. CsBr or CsI, whereas the other crucible can be filled with a predominant or even an exclusive amount of dopant precursor as e.g. EuOBr or TlI. In another preferred embodiment one crucible, e.g. the crucible with the raw material providing the dopant or activator precursor, may be located more close to the support. The precursor raw materials are heated at least to the melting point and the layers are formed from the evaporated material.

In favour of image sharpness needle shape codoped alkali metal halide scintillators, and more particularly, Tl-activated CsI scintillators are preferred. In order to improve a modulation transfer function (MTF) associated with scintillator layers having needle shaped crystals, a diameter size of the needle crystal is preferably 1 μm to 20 μm and is more preferably 1 μm to 10 μm. In a method according to a preferred embodiment of the present invention it is further recommended that this method comprises a step wherein a vapour deposition rate is in the range from 0.4 to 4 mg/cm$^2$.min.

Since the width of the needle shape crystal is influenced by the temperature of the substrate, the degree of vacuum and the incident angle of a vapour stream with the substrate, a desired width of needle shape crystal can be obtained by controlling those parameters. The methods of the present invention are very suitable in achieving these requirements.

In view of an improved sensitivity, annealing of said scintillators as in U.S. Pat. No. 6,730,243 is advantageously performed, wherein the annealing step consists of bringing the cooled deposited needle layer on the substrate to a temperature between 80 and 220° C. and maintaining it at that temperature for between 10 minutes and 15 hours. Such an annealing step may be done in an ambient or in an inert atmosphere.

Vapour Deposition of a Preferred Embodiment of the Scintillator Layer.

A preferred embodiment of the invention includes the vapour deposition of caesium iodide based scintillators. Caesium iodide based scintillators are obtained by adding thallium (Tl), sodium (Na) or europium (Eu) to caesium iodide (CsI) as an activator. The most preferable preferred embodiment is based on thallium doped caesium iodide. It is preferable that the molar ratio of thallium to caesium iodide (hereinafter, referred to as a "Tl/CsI ratio") is from 0.1 mol % to 0.55 mol %. More preferably, the Tl/CsI ratio is from 0.15 mol % to 0.4 mol %. Preferably, the vacuum deposition chamber includes two crucibles for heating caesium iodide (CsI) and thallium iodide (TlI) as the scintillator precursor raw materials of the scintillator, separately. The substrate having a ferromagnetic layer comprising for example iron particles is fixed to the substrate supporting body by means of magnetic forces. By adjusting the temperature of each crucible while rotating the substrate supporting body using a rotation mechanism of the vacuum deposition chamber, the amount of evaporation of each material is adjusted to set a predetermined Tl/CsI ratio (for example, 0.5 mol %). The temperature of the substrate can be controlled and is preferably between 90 and 170° C. The temperature of the crucibles is preferably between 420° C. and 700° C. Both raw materials can be present divided into two or more crucibles with a different ratio in weight of raw materials. For example one crucible with a predominant or even an exclusive amount of CsI, whereas the other crucible can be filled with a mixture of CsI and TlI or an exclusive amount of TlI. After the start of deposition, non-needle shape crystals can be first formed on the substrate and the needle shape crystals are formed continuously on the non-needle shape crystals by changing either the degree of vacuum or the temperature of the substrate. When the thickness reaches the predetermined thickness of the scintillator layer, the deposition may be ended by stopping the heating of the crucible and the heating of the substrate and/or by closing a shutter placed on top of each crucible. The deposition may also be ended by exhaustion of the scintillator precursor raw materials in the crucibles. The thickness of the scintillator layer is preferably between 100 μm and 700 μm.

An annealing step in the case of CsI:Tl is optional. It can be performed in the same way as described above.

Vapour Deposition of Phosphors.

A method of deposition according to a preferred embodiment of the present invention is also suitable for preparing a phosphor layer on a substrate. These phosphors are very suitable to be used in CR imaging applications. Therefore heating in one or more crucibles of phosphor precursor raw materials must be performed. These phosphor precursor raw materials comprise matrix compounds and activator and/or dopant precursor compounds. The precursor raw materials are heated up to at least the melting point and the layers are formed by condensation of the evaporated material.

Suitable matrix compounds are alkali halides (MX, where M represents alkali metals such as lithium (Li), sodium (Na), potassium (K), rubidium (Rb), caesium (Cs) and X represents halides such as fluoride (F), chloride (Cl), bromide (Br), iodide (I). The dopant precursor material is preferably a lanthanide salt, more preferably a lanthanide halide. Preferable phosphors as obtained by physical vapour deposition are caesium bromide doped with europium (CsBr:Eu) and rubidium bromide dopes with thallium (RbBr:Tl). Additional examples of phosphor layers are described in U.S. Pat. Nos. 5,736,069 and 6,802,991.

The phosphor precursor raw material(s) can be present in the same crucible or divided into two or more crucibles with a different ratio in weight of raw materials. For example one crucible with a predominant or even an exclusive amount of the matrix compound as e.g. CsBr or CsI, whereas the other crucible can be filled with a predominant or even an exclusive amount of dopant precursor as e.g. EuOBr or TlI. In another preferred embodiment one crucible, e.g. the crucible with the raw material providing the dopant or activator precursor, may be located more close to the support. The precursor raw materials are heated to at least the melting point and the layers are formed from the evaporated material.

In favour of image sharpness needle shaped codoped alkali metal halide phosphors, and more particularly, Eu-activated CsBr phosphors as described in US-A 2003/0091729 are preferred. In order to improve a modulation transfer function (MTF) associated with phosphor having needle shaped crystals, a diameter size of the needle crystal is preferably 1 μm to 20 μm and is more preferably 1 μm to 10 μm. In a method according to a preferred embodiment of the present invention it is further recommended that this method comprises a step wherein a vapour deposition rate is in the range from 0.4 to 4 mg/cm$^2$.min.

Since the width of the needle-crystal is influenced by the temperature of the substrate, the degree of vacuum and the incident angle of a vapour stream with the substrate, a desired width of needle crystal can be obtained by controlling those parameters. The methods of the present invention are very suitable in achieving these requirements.

In view of an improved sensitivity, annealing of said phosphors as in U.S. Pat. No. 6,730,243 is advantageously performed, wherein the annealing step consists of bringing the cooled deposited needle layer on the substrate to a temperature between 80 and 220° C. and maintaining it at that temperature for between 10 minutes and 15 hours. Such an annealing step may be done in an ambient or in an inert atmosphere.

The Imaging Array and Second Substrate

The imaging array used in the RFPD has to convert the light from the scintillator into electrical charges. Preferably this is done via a combination of photoelectric conversion elements and a TFT (Thin Film Transistor), but a CCD can also be used to convert the light into electrical charges. In case of a combination of photoelectric conversion elements and a TFT, light originating from the scintillator is guided towards an amorphous silicon photodiode layer which converts the light into electrons and electrical charges are created. The charges are collected and stored by the storage capacitors. A thin-film transistor (TFT) array adjacent to amorphous silicon read out the electrical charges and an image is created. Examples of suitable image arrays are disclosed in U.S. Pat. No. 5,262,649 and by Samei E. et al., "General guidelines for purchasing and acceptance testing of PACS equipment", Radiographics, 24, 313-334. Preferably, the imaging arrays as described in US2013/0048866, paragraph [90-125] and US2013/221230, paragraphs [53-71] and [81-104] can be used.

The charges must be read out by readout electronics. Examples of readout electronics in which the electrical charges produced and stored are read out row by row, are disclosed by Samei E. et al., Advances in Digital Radiography. RSNA Categorical Course in Diagnostic Radiology Physics (p. 49-61) Oak Brook, Ill.

The supporting substrate of the imaging array, hereafter denoted as the 'second substrate' is usually glass. However, imaging arrays fabricated on substrates made of plastics, metal foils can also be used. The imaging array can be protected from humidity and environmental factors by a layer of silicon nitride or polymer based coatings such as fluoropolymers, polyimides, polyamides, polyurethanes and epoxy resins. Also polymers based on B-staged bisbenzocyclobutene-based (BCB) monomers can be used. Alternatively, porous inorganic dielectrics with low dielectric constants can also be used.

Method of Making the RFPD

The RFPD is made by assembling the different components which are described above. A preferred method is now described.

In a first step the scintillator layer deposited on the radiation transparent substrate with its side opposite to the radiation transparent substrate must be bonded to the imaging array. This bonding can be done by means of pressing the scintillator layer against the imaging array mechanically, for example by vacuum or by means of an adhesive provided at the edges of the imaging array. Preferably the scintillator layer and the imaging array are bonded by means of an adhesive layer between both components. The advantage of a bonding by means of an adhesive layer is that an optical coupling is obtained between the scintillator layer and the imaging array that enhances the RFPD efficiency and resolution.

No limitations are imposed on the adhesive layer as long as it allows light emitted from the scintillator to reach the imaging array without attenuation. For example, the adhesive layer may be made of an adhesive such as a UV-curing adhesive, a heat-curing adhesive, a room-temperature-curing adhesive, a hot-melt resin, a pressure-sensitive adhesive such as a rubber pressure-sensitive adhesive, a silicone pressure sensitive adhesive, an acrylic pressure-sensitive adhesive, or a double-sided adhesive or pressure sensitive adhesive sheet both surfaces of which are provided with one of the above adhesives and pressure-sensitive adhesives.

Among the above-mentioned pressure-sensitive adhesives, it is preferable to use an acrylic pressure-sensitive adhesive which is less prone to deteriorate due to oxidation or exposure to light.

Among the above mentioned hot melt resins, it is preferable to use polyethylene-vinyl acetate, polyolefins, polyamides, polyesters, polyurethanes, styrene block copolymers, polycarbonates, fluoropolymers, silicone rubbers, polypyrrole. The most preferred ones are polyolefins and polyurethanes due to the higher temperature resistance and stability. The hot melt with a lining is placed onto the surface of the imaging array. The imaging array on the first substrate, together with the hot melt is then heated in an oven at a prescribed temperature. After cooling, the lining is removed and releases a melted hot melt with a free adhesive side. The scintillator is coupled to the imaging array by bringing the scintillator layer with its side opposite to the radiation transparent substrate in contact with the adhesive side of the hot melt and by applying a high pressure at a high temperature. To achieve a good sticking over the complete area of the imaging array, a pressure in a range from 0.6 to 20 bars has to be applied and a temperature value in a range from 80-220° C., during between 10 and 1000 s is required. It is preferable that the thickness of the hot melt resin be in the range of 5 to 40 µm, even more preferably in the range of 5 to 30 µm, most preferably between 5 and 15 µm.

A stack of radiation transparent substrate/scintillator layer/imaging array/second substrate is thereby formed.

Optionally, an X-ray shield can be positioned against the side of the second substrate, opposite to the imaging array, to absorb X-rays which were not absorbed by the scintillator. These X-rays can cause image artefacts due to non-uniform reflection by the underlying electronics of the detector or can damage the electronic components making part of the underlying electronics.

The X-ray shield can be applied directly onto the side of the second substrate opposite to the imaging array as described in the unpublished patent application EP13197736.5. Alternatively, X-ray shields of metals such as tantalum, lead or tungsten as disclosed in EP1471384B1, US2013/0032724A1 and US2012/0097857A1 can be positioned against the second substrate opposite to the imaging array to serve as X-ray shield.

More preferably, the X-ray shields as disclosed in the unpublished patent application EP13197734.0 are used in combination with the present invention because these shields have the benefit of a further weight reduction of the radiographic flat panel detector.

The present invention is compatible with the configurations wherein the RFPD is oriented such that the scintillator is present between the X-ray source and the imaging array (PSS=penetration side sampling) and wherein the RFPD is oriented such that the imaging array is present between the X-ray source and the scintillator (ISS=irradiation side sampling).

While the present invention will hereinafter in the examples be described in connection with preferred embodiments thereof, it will be understood that it is not intended to limit the invention to those preferred embodiments.

EXAMPLES

Materials
  Vapour deposition vacuum chamber Q700 Leybold-Heraeus;
  Permanent magnets: 50×50×1.5 mm, made of Samarium Cobalt ($Sm_2Co_{17}$) from Goudsmit Magnetic Supplies, Netherlands;
  Magnetic foil: GraviFlex® Magnetfolie 200 from Schallenkammer;
  Heat resistant glue: FT 2002: from Avery Dennison, Belgium;
  Kraton FG1901X: (new name=Kraton™ FG1901 GT), a clear, linear triblock copolymer based on styrene and ethylene/butylene with a polystyrene content of 30%, from Shell Chemicals;
  Iron powder: particle size smaller than 10 µm from Acros Chimica NV;
  Aluminium plate; AlMg 4, 5 Mn (5083) with a thickness of 2.5 mm from Dejond, Belgium;
  Glass plate: window glass with a thickness of 3 mm;
  HPA1902W: pressure sensitive adhesive tape, 190 µm, from Avery Dennison, Belgium;
  $TiO_2$ R900:Ti-Pure® R-900 Titanium Dioxide from DuPont;
  Filter AU09E11NG with pore size of 20 µm from 3M;
  CAB 381-2: 20 (wt.) % solution of Cellulose Acetate Butyrate (CAB-381-2) from Eastman in MEK. Prepared by stirring for 8 hours at 1600 rpm and filtering with Filter AU09E11NG after stirring;
  Baysilone: Baysilone Paint additive MA from Bayer;
  Ebecryl: 20 (wt.) % solution of Ebecryl 1290, a hexafunctional aliphatic urethane acrylate oligomer from Allnex in MEK, prepared by stirring for 8 hours at 1600 rpm and filtering with Filter AU09E11NG after stirring;
  PI500B: Kapton, polyimide film having a thickness of 125 µm, from DuPont;
  Hostaphan WO: white opaque film made of PET having a thickness of 100 µm from Mitsubishi;
  LumirrorT0002: pigmented black polyester film, having a thickness of 188 µm, from Toray Europe, France;
  Teonex Q83: PEN transparent film, having a thickness of 125 µm, from DuPont Teijin;
  MelinexST504: polyester film, having a thickness of 125 µm from DuPont Teijin;
  Aluminium substrate: Aluminium foil having a thickness of 300 µm from Alanod;
  CsI: (CAS 7789-17-5) from Rockwood Lithium, 99.999%;
  CsI:Tll: from Rockwood Lithium, 99.999% CsI with 0.9% TlI.
  HI-BOND 3 hot melt: hot melt resin from Cardel Method of Vapour Depositing 1. Preparation of Substrates Having a Ferromagnetic Layer (Invention).

1.1. Preparation of the Light Reflecting Layer.

0.2 g of CAB 381-2 was mixed with 1 g of $TiO_2$ R900, 0.001 g of Baysilone and 2.6 g of MEK in a horizontal agitator bead mill for at least 1 hour. Finally Ebecryl was added to achieve a CAB 381-2: Ebecryl ratio of 1:1 (wt.). The obtained coating dispersion was filtered with Filter AU09E11NG. The solid content of $TiO_2$ R900 is 35 (wt.) %. The coating dispersion was coated with a doctor blade at a coating speed of 2 m/min on a side of different radiation transparent substrates on which the scintillator layer shall be deposited. The size of the substrates was 180×240 mm. The wet layer thickness was 150 µm as to obtain a dry layer thickness of 17 µm. The drying of the pre-coat was done at room temperature for at least 15 min, followed by drying in an oven for 30 min at 60° C. and 20 min at 90° C. On substrate S-05 (see Table 1) no pre-coat was applied.

1.2. Preparation of the Ferromagnetic Layer.

A dispersion of magnetizable particles was made as follows: 4.64 g of Kraton FG1901X was dissolved in a solvent mixture containing 6.69 g of methylcyclohexane, 4.68 g of toluene and 2.01 g of butylacetate. After stirring for 10 minutes, 150 g of the iron powder was added to the binder solution and stirred for 10 minutes. The dispersion was homogenized for 1 h in a closed container on a rolling bench. The obtained dispersion of iron particles was doctor blade coated at a speed of 2 m/min onto different substrates mentioned in Table 1. The coating was done on the side opposite to the side having the pre-coat. The wet coating thickness was 275 µm and a layer with a dry thickness of 85 µm and a coating weight of iron between 10 and 40 mg/cm² was obtained after drying. The drying was done during the first 15 min in air having a RH of 30%, followed by a drying step in an oven for 30 min at 60° C. and 20 min at 90° C.

TABLE 1

| Radiation transp. substrate | Layer/foil | Coating weight mg Fe/cm² | | Sample Nr |
|---|---|---|---|---|
| Hostaphan WO | Iron particles | 12.4 | INV | S-01 |
| Hostaphan WO | Iron particles | 27.4 | INV | S-02 |
| LumirrorT0002 | Iron particles | 31.9 | INV | S-03 |
| TeonexQ83 | Iron particles | 37.8 | INV | S-04* |
| TeonexQ83 | Iron particles | 37.8 | INV | S-05 |
| TeonexQ83 | Iron particles | 35.2 | INV | S-06 |
| MelinexST504 | Iron particles | 36.9 | INV | S-07 |
| MelinexST504 | Iron particles | 25.5 | INV | S-08 |
| PI500B | Iron particles | 30.4 | INV | S-09 |
| Aluminium substrate | Iron particles | 33.5 | INV | S-10 |
| PI500B | Magnetic foil | — | COMP | S-11 |
| Aluminium substrate | Magnetic foil | — | COMP | S-12 |

*no pre-coat was applied

2. Preparation of Radiation Transparent Substrates with a Magnetic Foil (Comparatives)

The Aluminium plate and the PI500B substrate were coated with a pre-coat according to §1.1. A magnetic foil was glued with pressure sensitive adhesive tape HPA1902W onto the substrate at the side opposite to the pre-coat.

3. The Substrate Supporting Body.

A first substrate supporting body SSB-01 was made by placing permanent magnets on one of the surfaces of the glass plate. A large area was obtained by putting the magnets together in a 2-dimensional array of 7 rows and 8 columns. The magnets were glued on the glass with the heat resistant glue. The surface area of the surface of the substrate supporting body was 350×450 mm.

A second substrate supporting body SSB-02 was made by placing the permanent magnets on one of the surfaces of the aluminium plate. A large area was obtained by putting them in contact with each other in a 2-dimensional array of 7 rows and 8 columns. The surface of the substrate supporting body was 350×450 mm. The magnets at the edges of the array were fixed to the aluminium surface with the HPA1902W tape.

A third substrate supporting body SSB-03 was made by placing the permanent magnetic foil on one of the surfaces of the aluminium plate. The surface of the substrate supporting body was 210×270 mm. The magnetic foil was fixed to the aluminium surface with the HPA1902W tape.

4. The Vapour Deposition Vacuum Chamber.

The substrate supporting bodies obtained in the previous sections were placed in a rotatable holder suspended in the vacuum chamber and which allows a horizontal rotation of the substrate supporting body. The substrate supporting bodies were horizontally placed in the holder with the side of the glass or aluminium plate opposite to the magnets, directed to the crucibles placed on the bottom of the vacuum chamber. Two crucibles were placed next to each other at a distance of 140 mm from the substrate and the crucibles can be both resistively heated independently from each other.

The radiation transparent substrates S-01 to S-12 with on a side having the ferromagnetic layer containing the iron particles (INV) or having a magnetic foil (COMP) are brought in contact with the surface of the glass or aluminium plate at the opposite side of the magnets or in contact with the magnetic foil (SSB-03). Due to the magnetic attracting power between the magnets or foil and the layer comprising the iron particles, the radiation transparent substrates are kept fixed to the substrate supporting body.

5. The Vapour Deposition of the Scintillator Layer.

Before the start of the evaporation, the air in the vacuum chamber was evacuated to a pressure of $5 \cdot 10^{-5}$ mbar and during the evaporation process argon gas was introduced in the chamber. The substrate supporting bodies were rotated at 12 rpm and were heated to a temperature between 100 and 140° C.

A scintillator layer of CsI:Tl on each of the radiation transparent substrates S-01 to S-12 was applied via physical vapour deposition by heating 420 g of CsI to 680° C. in one crucible and 350 g of CsI:TlI containing 0.9 (wt.) % of TlI in a second separate crucible between 200 an 550° C.

After all the powder present in at least one of the crucibles was evaporated, the heating was switched off and a cover was placed on top of the crucibles. The radiation transparent substrate with the scintillator layer was removed from the substrate supporting body when the substrate temperature reached 60° C.

The evaluation of the quality of the obtained scintillator layers on the different radiation transparent substrates was done visually during manipulation of the substrate with the scintillator deposited. The results are summarised in Table 2.

TABLE 2

| Nr. | | Radiation transparent substrate + ferromagnetic layer or magnetic foil | Substrate supporting body | Scintillator layer quality |
| --- | --- | --- | --- | --- |
| 1 | INV | S-01 | SSB-02 | good adhesion, scintillator layer is brittle |
| 2 | INV | S-02 | SSB-02 | good adhesion, flat after deposition, small cracking of the scintillator layer |
| 3 | INV | S-03 | SSB-02 | good adhesion, very good deposition quality |
| 4 | INV | S-04 | SSB-02 | good adhesion, very flexible scintillator layer |
| 5 | INV | S-05 | SSB-02 | good adhesion, very flexible scintillator layer, pattern of the magnets visible in scintillator layer |
| 6 | INV | S-06 | SSB-02 | good adhesion, very flexible scintillator layer |
| 7 | INV | S-09 | SSB-02 | good adhesion, very flexible scintillator layer, small cracks visible under microscope |
| 8 | INV | S-05 | SSB-03 | good adhesion, very flexible scintillator layer |
| 9 | INV | S-07 | SSB-03 | good adhesion, very flexible scintillator layer, pattern from the magnetic foil visible |
| 10 | INV | S-08 | SSB-03 | good adhesion, very flexible scintillator layer |
| 11 | INV | S-09 | SSB-03 | good adhesion, very flexible scintillator layer, small cracks visible under microscope |
| 12 | INV | S-10 | SSB-03 | Good adhesion of the scintillator |
| 13 | COMP | S-11 | SSB-03 | bad adhesion of the scintillator to the substrate |
| 14 | COMP | S-12 | SSB-03 | PI 500B foil was decoupling from magnetic foil. No vapour deposition of scintillator possible |

According to the results reported in Table 2, vapour deposition of scintillator on radiation transparent substrates having a layer comprising iron particles, results in scintillator layers showing a good adhesion to the substrate and showing a high flexibility. The methods according to the invention have the advantage, that even without a pre-coat (S-04), sufficient adhesion of the scintillator layer to the radiation transparent substrate is obtained.

6. X-ray Conversion Efficiency of Scintillators.

The conversion efficiency of the scintillators as prepared in §5 was determined in a scintillator layer/radiological film set-up. To guarantee optimal contact between scintillator layer and radiological film a vacuum packaging was used. The scintillator layer was brought in contact with a green sensitive film (AGFAHDRC1824) with one active side radiological emulsion and both the scintillator with its substrate and the green sensitive film were placed in a black polyethylene bag. The whole package was light tight and vacuum packaged. Exposure was through the scintillator, in front of the radiological film. The exposure for measuring the conversion efficiency was performed with a Philips Super 80 CP X-ray source with following conditions: 72 kVp, E-filter, distance range over 615 cm, 21 steps with dlogH of 0.10, 10 mAs, small focus. The substrate side having the ferromagnetic layer or the magnetic foil directed towards the X-ray source. After exposure, the radiological film was developed in G138i (Agfa Healthcare) at 33° C. for 90 s and placed in a MacBeth densitometer, type TR-924 to measure the optical density of the developed film. The conversion efficiency was determined by means of the density graph in the region wherein the density is linear with the irradiation dose and was calculated relative to the scintillator deposited.

Since the vapour deposition of the scintillator on PI550B having a magnetic foil is very problematic due to the decoupling of the radiation transparent substrate from the PI500B foil, the deposition of the scintillator layer was performed using the pressure sensitive tape to keep the PI500B foil stuck to the substrate supporting body SSB-03. The results of the conversion efficiency of the scintillators deposited on S-09 to S-12 are reported in Table 3.

The X-ray absorption was measured with a Philips Optimus 80 apparatus together with a Triad dosimeter having a 30 cc volume cell. The measuring cell was placed at 1.5 m distance from the X-ray source directly behind the scintillator/radiation transparent substrate combination. The combination was placed with its substrate directed to the X-ray source. Data for each sample were collected multiple times and the average value was calculated together with the standard deviation. All tests were done for standard radiation X-ray beam qualities (RQA X-ray beam qualities as defined in IEC standard 61267, 1$^{st}$ Ed. (1994)): RQA5 (21 mm Al, 73 kV), and RQA9 (40 mm Al, 117 kV). The results are reported in Table 3.

TABLE 3

| Rad. transp. substrate + ferro-magnetic layer or magnetic foil | | Conversion efficiency (%) relative to INV | X-ray absorption (%) RQA5 | X-ray absorption (%) RQA9 |
|---|---|---|---|---|
| S-09 | INV | 100 | 65 | 40 |
| S-11 | COMP | 61 | 74 | 49 |
| S-10 | INV | 100 | 66 | 41 |
| S-12 | COMP | 59 | 75 | 50 |

The absorption of the X-rays by the scintillator/radiation transparent substrate/magnetic foil or ferromagnetic layer combination was measured. Since the conditions of the vapour deposition of the scintillator were always the same, it can be assumed that the thickness of the scintillator layer is comparable for all samples. The difference in X-ray absorption is hence to be attributed to a difference in absorption by the radiation transparent substrate/magnetic foil or ferromagnetic layer combination, which should be as low as possible in order to minimise the loss of X-ray photons in the substrate and hence minimize the X-ray dose for the patient.

The scintillators deposited on a radiation transparent substrate having a ferromagnetic layer according to preferred methods of the invention show a higher conversion efficiency for X-rays than the scintillators deposited on substrates having a magnetic foil on the opposite side of the scintillator layer. Higher conversion efficiency for X-rays means a lower X-ray dose for the image formation.

From the X-ray absorption measurements it follows that the radiation transparent substrate/magnetic foil combination shows a significant higher X-ray absorption than the radiation transparent substrate/ferromagnetic layer combination. A lower X-ray absorption by the ferromagnetic layer results in a higher availability of X-ray photons for the image formation. Both above observed advantages result in a lower X-ray dose for the image formation.

7. ESD Shielding

The surface resistance of the radiation transparent substrate Teonex Q83 having a size of 180×240 mm and the radiation transparent substrate Teonex Q83 with a layer comprising iron particles (S-06) were measured with a Surface Resistance Meter SRM®110 from Romex B.V. The meter was put in contact with the surface of Teonex Q83 or with the surface of the layer comprising the iron particles and following values were obtained: Teonex Q83 had a surface resistance between $10^{11}$ and $10^{12}$ Ω/sq. This is insulating and hence is not safe for use in an Electrostatic Discharge Protected Area (EPA). The surface resistance of S-06 ranged between $10^8$ and $10^9$ Ω/sq. This is dissipating and safe in an EPA area.

Electric charge build-up on Teonex Q83 and S-06 were measured with Electrostatic Field meter EFM 51 from Romex B.V. For this purpose material was removed from the table. Simply removing the radiation transparent substrates from the table lead to the following voltages on the substrate sheets: Teonex Q83: >400 Volt, S-06: 50 Volt.

These results show that the radiation transparent substrate with a layer comprising magnetizable particles gives a higher Electrostatic Discharge shielding effect than radiation transparent substrates without the layer comprising magnetizable particles. This higher ESD is advantageous because it protects the RFPD from ESD damage. With the layer comprising magnetizable particles in the RFPD, there is no need to add an additional ESD protecting layer which contributes to the lowering weight and cost of the RFPD.

Making of the Radiographic Flat Panel Detector

A RFPD was prepared by bringing the scintillator layer, with its side opposite to the radiation transparent substrate, in contact with the imaging array on the second substrate made of glass (Corning Lotus™ Glass). The glass plate has an area of 440 mm×365 mm and a thickness of 0.7 mm. The imaging array having an area of 425.088 mm×354.240 mm is made up of photoelectric conversion elements (PIN type photodiodes) and a TFT (Thin Film Transistor) formed on an amorphous silicon layer (a-Si:H) in contact with the glass substrate.

To assure good optical contact between the scintillator layer and the imaging layer, a hot melt resin layer HI-BOND 3 and not thicker than 35 μm, was used for bonding the scintillator layer with the imaging array. The bonding was achieved by placing the hot melt with a lining on the surface of the imaging array on the glass. The glass with the imaging array was then put into an oven and kept at a temperature of 85° C. for 10 minutes. After cooling, the lining was removed to release the adhesive side of the melted hot melt. Subsequently, the scintillator layer on a radiation transparent substrate (sample S-06) with its side opposite to the radiation transparent substrate was brought into contact with the adhesive surface of the hot melt at high pressure and high temperature. To achieve a good sticking over the complete area a pressure in a range of 0.8 bar was applied, at a temperature of 100° C., for 10 min.

The invention claimed is:

1. A method for producing a radiographic flat panel detector comprising the steps of:
   providing a radiation transparent substrate with a layer including magnetizable particles;
   contacting the radiation transparent substrate including the layer including magnetizable particles with a surface of a substrate supporting body positioned between one or more magnets and the radiation transparent substrate;
   applying a scintillator layer on the radiation transparent substrate by vapour deposition while the radiation transparent substrate is fixed by magnetic forces to the substrate supporting body; and
   bonding a surface of the scintillator layer that is not in contact with the radiation transparent layer to an imaging array that is provided on a second substrate.

2. The method for producing a radiographic flat panel detector according to claim 1, wherein the layer including magnetizable particles is coated from a dispersion including magnetizable particles and a binder.

3. The method for producing a radiographic flat panel detector according to claim 1, wherein, prior to the step of contacting:
   applying a light reflecting layer onto a side of the radiation transparent substrate.

4. The method for producing a radiographic flat panel detector according to claim 2, wherein, prior to the step of contacting:
   applying a light reflecting layer onto a side of the radiation transparent substrate.

5. The method for producing a radiographic flat panel detector according to claim 1, wherein, prior to the step of contacting:
   applying an adhesion promoting layer onto a side of the radiation transparent substrate.

6. The method for producing a radiographic flat panel detector according to claim 1, wherein the step of bonding is performed by melting a hot melt resin layer between the scintillator layer and the imaging array.

* * * * *